(12) United States Patent
Hazelton

(10) Patent No.: US 7,164,466 B2
(45) Date of Patent: Jan. 16, 2007

(54) DETACHABLE HEAT SINK

(75) Inventor: Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 309 days.

(21) Appl. No.: 10/228,813

(22) Filed: Aug. 27, 2002

(65) Prior Publication Data

US 2004/0040694 A1    Mar. 4, 2004

(51) Int. Cl.
*G03B 27/58*    (2006.01)
*G03B 27/62*    (2006.01)

(52) U.S. Cl. .......................... 355/72; 355/75
(58) Field of Classification Search .......... 355/30, 355/53, 72–76; 310/10, 12; 165/46, 80.2
See application file for complete search history.

(56) References Cited

U.S. PATENT DOCUMENTS

| | | | |
|---|---|---|---|
| 5,413,167 A * | 5/1995 | Hara et al. ............... | 165/86 |
| 5,610,965 A | 3/1997 | Mori et al. ............... | 378/34 |
| 6,108,937 A | 8/2000 | Raaijmakers ............ | 34/433 |
| 6,209,220 B1 | 4/2001 | Raaijmakers ............ | 34/66 |
| 6,259,062 B1 | 7/2001 | Pan ......................... | 219/390 |
| 2003/0035088 A1* | 2/2003 | Emoto ...................... | 355/53 |
| 2004/0156026 A1* | 8/2004 | Kamiya .................... | 355/30 |

FOREIGN PATENT DOCUMENTS

| | | |
|---|---|---|
| JP | 09092613 A * | 4/1997 |
| WO | WO 01/11431 | 2/2001 |

* cited by examiner

*Primary Examiner*—Henry Hung Nguyen
(74) *Attorney, Agent, or Firm*—Aka Chan LLP

(57) ABSTRACT

Methods and apparatus for collecting heat within a precision stage system substantially without introducing significant disturbance forces to the system are disclosed. According to one aspect of the present invention, a method for substantially removing heat from a first location within an overall stage apparatus includes providing the heat from the first location to a heat transferring mechanism that carries the heat away from the first location. The heat is transferred from the heat transferring mechanism to a second location associated within the stage apparatus. The second location includes a material that is arranged to store the transferred heat. The method also includes storing the heat substantially within the material. In one embodiment, the heat is generated at the first location.

31 Claims, 8 Drawing Sheets

DETACHABLE HEAT SINK

BACKGROUND OF THE INVENTION

1. Field of Invention

The present invention relates generally to semiconductor processing equipment. More particularly, the present invention relates to a relatively compact, detachable heat sink arrangement which enables heat generated by actuators to be absorbed by the heat sink arrangement substantially without requiring a significant tube arrangement to carry the heat from a wafer stage.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by disturbance forces or by excessive heat, products formed using the precision instrument may be improperly formed and, hence, defective. For instance, a photolithography machine which is subjected to disturbance forces may cause an image projected by the photolithography machine to move, and, as a result, be aligned incorrectly on a projection surface such as a semiconductor wafer surface.

Scanning stages such as wafer scanning stages and reticle scanning stages are often used in semiconductor fabrication processes, and may be included in various photolithography and exposure apparatuses. Wafer scanning stages are generally used to position a semiconductor wafer such that portions of the wafer may be exposed as appropriate for masking or etching. Reticle scanning stages are generally used to accurately position a reticle or reticles for exposure over the semiconductor wafer. Patterns are generally resident on a reticle, which effectively serves as a mask or a negative for a wafer. When a reticle is positioned over a wafer as desired, a beam of light or a relatively broad beam of electrons may be collimated through a reduction lens, and provided to the reticle on which a thin metal pattern is placed. Portions of a light beam, for example, may be absorbed by the reticle while other portions pass through the reticle and are focused onto the wafer.

A stage such as a wafer scanning stage or a reticle scanning stage is typically supported by a base structure such that the stage may move in a linear direction. The base structure often includes or houses various sensors and actuators which serve to control the motion of the stage and a table, e.g., a wafer table, which is a part of an overall stage apparatus. Such actuators are often arranged to control a coarse stage of an overall wafer stage, and include coils which generate heat. The heat generated by the coils may be relatively significant, e.g., significant enough to affect an exposure process performed using the overall wafer stage. The heat generated may result in a temperature rise of, for example, of approximately 10 degrees Celsius to approximately 20 degrees Celsius higher than a desired ambient temperature. Since the heat generated by the coils may adversely affect the performance of the overall wafer stage, the generated heat is generally carried away or otherwise removed from the vicinity of relatively critical components of the overall wafer stage. Carrying heat away from relatively critical components, as for example a wafer, reduces the effect of excessive heat on the critical components.

In order to effectively conduct heat away from critical components of an overall wafer stage, tubes are often incorporated into overall wafer stage designs. The tubes may be arranged to carry coolant from a coolant supply or source effectively to the heat generating coils in order to allow the generated heat to be carried away from the heat generating coils by the coolant. Often, multiple tubes which are relatively long may wind from an external coolant supply through the overall wafer stage. Coolant which has effectively absorbed the generated heat may then pass through the tubes to an external cooling system which may cool the coolant or otherwise remove the heat from the coolant.

While the use of multiple tubes which carry coolant is effective in transferring heat away from critical components of an overall wafer stage system, e.g., a precision stage system, the use of tubes often introduces disturbances within the system. Such disturbances, which may be relatively large, generally include disturbance forces. The disturbance forces may be caused when tubes are pulled as precision stages move. In other words, tube drag may give rise to significant disturbance forces. Both tube drag and disturbance forces may create problems within the precision stage system. For instance, the accuracy with which the precision stages may be positioned may be compromised, particularly when disturbance forces are relatively large and have a significant effect on the positioning of a wafer.

Therefore, what is needed is a method and an apparatus for reducing the effect of heat generated by coils within an overall stage apparatus. That is, what is desired is a method and an apparatus for carrying heat away from coils associated with an overall stage apparatus substantially without introducing significant disturbance forces within the overall stage apparatus.

SUMMARY OF THE INVENTION

The present invention relates to collecting heat within a precision stage system substantially without introducing significant disturbance forces to the system. According to one aspect of the present invention, a method for substantially removing heat from a first location within an overall stage apparatus includes providing the heat from the first location to a heat transferring mechanism that carries the heat away from the first location. The heat is transferred from the heat transferring mechanism to a second location associated within the stage apparatus. The second location includes a material that is arranged to store the transferred heat. The method also includes storing the heat substantially within the material. In one embodiment, the heat is generated at the first location.

Allowing heat generated by actuators to be stored by a material within a precision stage device during a wafer exposure process enables the ambient temperature around the stage device to be maintained substantially without the adverse effect of disturbance forces that may arise due to mechanisms which carry heat out of the stage apparatus during a wafer exposure process. When the material is part of a detachable heat sink, once the wafer exposure process is completed, the detachable heat sink may be detached from the stage device and transferred to a heat removal station where the stored heat may be removed using substantially any conventional process. The use of such a detachable heat sink enables the effect of heat on critical components of the stage device to be reduced, without any significant adverse affect on the performance of the stage device in any other way.

According to another aspect of the present invention, a method for exposing a wafer located on a stage device includes operating an actuator to position the wafer such that heat is generated, and providing the heat from the actuator to a heat sink that is associated with the stage device. The heat sink is detachable with respect to the stage device, and stores the generated heat. In one embodiment, the method includes detaching the heat sink from the stage device.

In another embodiment, providing the heat from the actuator to the heat sink includes transferring the heat to a fluid and transferring the heat from the fluid to the heat sink. In such an embodiment, the fluid may be contained substantially within a heat pipe associated with the stage device. Alternatively, in such an embodiment, the fluid may be substantially circulated between the actuator and the stage device through the use of a pump device associated with the stage device.

According to still another aspect of the present invention, a stage apparatus includes a first stage, at least one actuator, a heat transferer, and a heat storage. The actuator controls motion of the first stage, and generates heat in the process. The heat transferer carries the heat away from the actuator, and the heat storage obtains the heat from the heat transferer and stores the heat. In one embodiment, the first stage is a fine stage and the stage device also includes a coarse stage. In such an embodiment, the heat storage is removably coupled to the coarse stage.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

When the ambient temperature around an overall precision stage device, e.g., an overall wafer stage device, is raised during a wafer exposure process, the performance of the stage device may be compromised. As a result, errors or inconsistencies may arise during a wafer exposure process that is performed using the stage device when the ambient temperature is raised, as for example from a desired temperature in the range of approximately 20 to approximately 25 degrees Celsius to a temperature in the range of approximately 30 to approximately 40 degrees Celsius. Often, heat which is generated by actuators associated with a stage device causes the ambient temperature to be raised. In order to reduce the amount by which the ambient temperature is raised, tubes which carry coolant from an external coolant source to the actuators may be entwined throughout the stage device and arranged to allow the generated heat to be transferred by the coolant to an external cooling system. While the use of tubes is generally effective in removing generated heat, the tubes may introduce relatively large disturbances within the stage device.

By allowing heat generated by actuators or, more specifically, heat generated by coils associated with actuators, to be carried away from the actuators and other critical components of an overall wafer stage device without requiring the use of a plurality of tubes which are entwined throughout the stage device, the ambient temperature around the stage device may be maintained substantially without the adverse effect of disturbance forces. In one embodiment, heat generated by actuators during a wafer exposure process may be stored in a detachable heat sink that is coupled to a portion of the stage device. When the wafer exposure process is completed, the detachable heat sink may be detached from the stage device and transferred to a heat removal station where the stored heat may be removed using substantially any conventional process. Such a detachable heat sink enables heat to be substantially prevented from affecting critical components of the overall stage device, and does not involve the use of tubes which are coupled to external mechanisms, e.g., external coolant sources or external cooling mechanisms.

Figure 1:
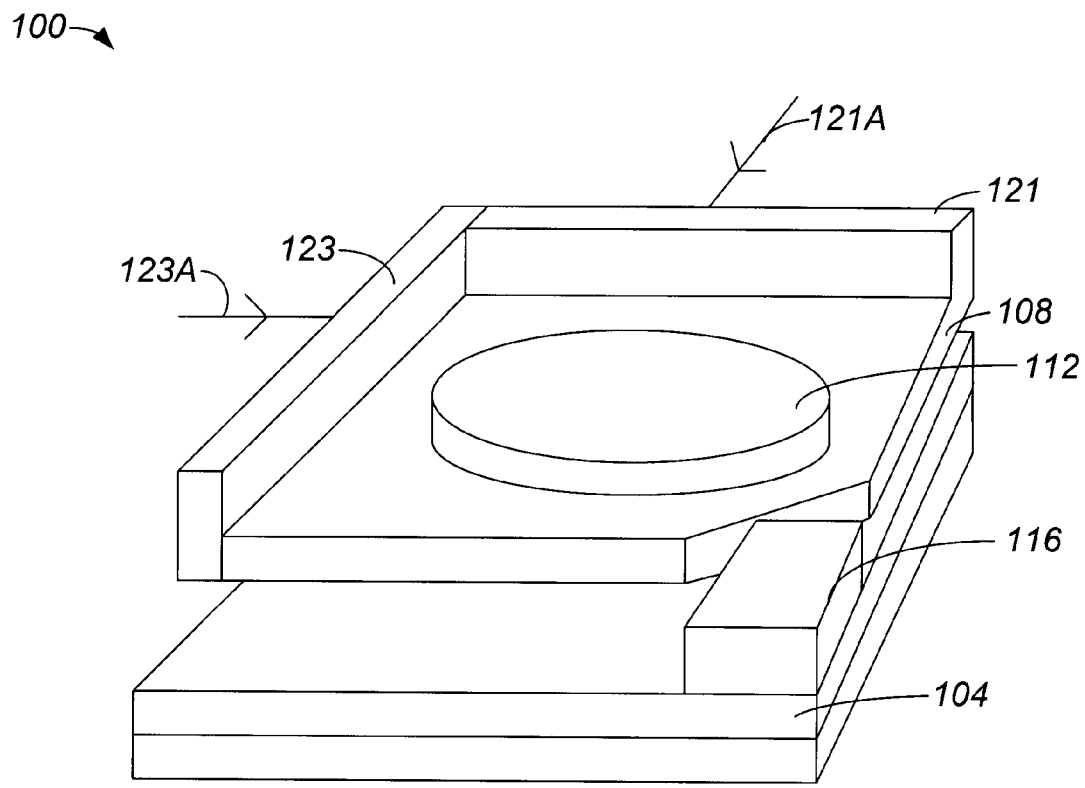
FIG. 1 is a diagrammatic representation of an overall wafer stage in accordance with an embodiment of the present invention.
Figure 1:
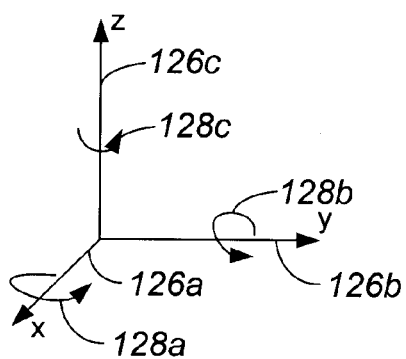

FIG. 1 is a diagrammatic representation of an overall wafer stage in accordance with an embodiment of the present invention. An overall wafer stage 100 includes a planar motor wafer stage 104 and a wafer table 108. In general, planar motor wafer stage 104 may be a coarse stage that is arranged to impart coarse movements, while wafer table 108 may be a fine stage that is arranged to impart finer movements. Wafer table 108 is generally arranged to support a wafer 112 while wafer 112 is being moved by overall wafer stage 100, i.e., by either or both planar motor wafer stage 104 or wafer table 108.

Wafer stage 104 typically includes sensors and actuators (not shown) which are arranged to substantially control the motion of wafer stage 104 and wafer table 108. Typically, the actuators include coils which generate heat when the actuators are in use. By effectively conducting the heat generated by the coils to a detachable heat sink 116, heat may be carried away from the actuators and other critical components of overall wafer stage 100 and stored within detachable heat sink 116. Hence, the effect of the generated heat on components of overall wafer stage 100, i.e., components which are sensitive to heat, may be reduced.

Detachable heat sink 116 is arranged to be detached from overall wafer stage 100 or, as shown, wafer stage 104 when an exposure process performed using overall wafer stage 100 is completed. Once detached, detachable heat sink 116 may be transferred to a heat removal station where the heat stored within detachable heat sink 116 may be removed using conventional methods, e.g., cooling methods, as will be known to those skilled in the art. If overall wafer stage 100 is to be used for a subsequent exposure process, then a new or cooled detachable heat sink 116 may be attached to or otherwise positioned on overall wafer stage 100 to store heat generated during the subsequent exposure process.

In one embodiment, detachable heat sink 116 may be formed from a metallic material which has a relatively high heat capacity. Suitable metals may include, but are not limited to, coppers and copper alloys. More generally, detachable heat sink 116 may be formed from substantially any material which has a relatively high heat capacity including, but not limited to, plastics, ceramics, metals, and combinations of the above. When detachable heat sink 116 is formed from a metallic material, detachable heat sink 116 may be formed as a block which may be readily coupled to wafer stage 104 and mechanisms associated with wafer stage 104 which enable detachable heat sink 116 to be quickly and easily detached from and reattached to wafer stage 104.

Figure 9:
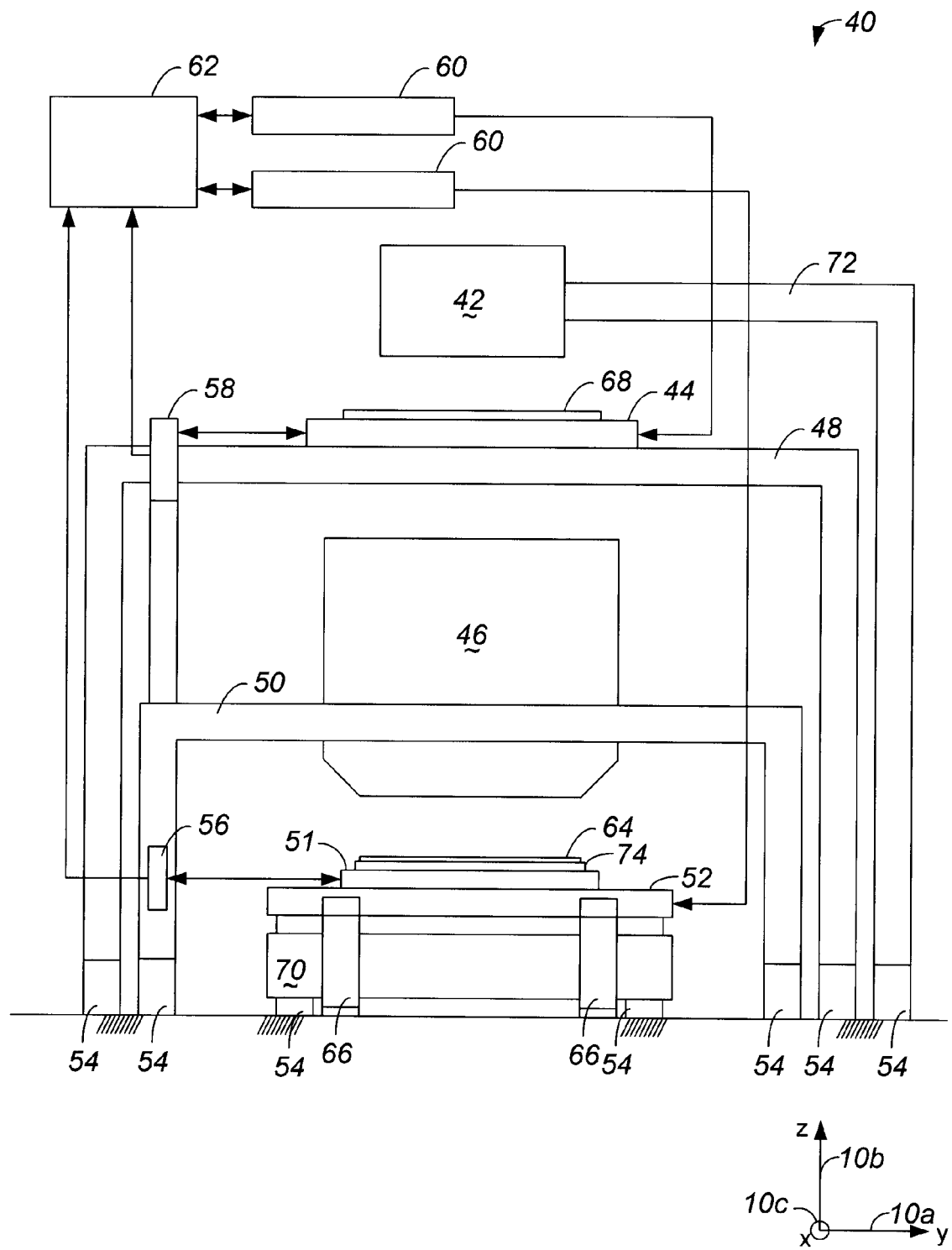
FIG. 9 is a diagrammatic representation of a photolithography apparatus in accordance with an embodiment of the present invention.

Wafer table 108 generally has two mirrors 121, 123 which are each arranged to reflect a beam emitted from at least one laser interferometer, e.g., an interferometer 56 as shown in FIG. 9 which will be discussed below. In one embodiment, an interferometer which emits a beam is arranged to detect the position of water table 108 in three to six directions. When the interferometer detects the position of wafer table 108 in three directions, the directions may be an x-direction 126$a$, a y-direction 126$b$, and a θz direction 128$c$. When the interferometer detects the position of wafer table 108 in six directions, the directions may be x-direction 126$a$, y-direction 126$b$, a z-direction 126$c$, a θx direction 128$a$, a θy direction 128$b$, and θz direction 128$c$.

Each mirror 121,123 is typically disposed on or about wafer table 108 along a different side of wafer table 108. As shown, wafer stage 104 may be formed in a substantially square shape, i.e., wafer stage 104 may have a substantially square footprint. Detachable heat sink 116 may be disposed, as shown, on wafer stage 104 at the corner of two sides of wafer stage 104 that are substantially opposite from the corner of the two sides of wafer table 108 on which mirrors 121, 123, are disposed. As a result, the temperature in optical paths 121$a$, 123$a$ of at least one laser interferometer may be substantially precisely maintained at a predetermined level since heat captured by heat sink 116 has very little influence on optical paths 121$a$, 123$a$.

Figure 2:
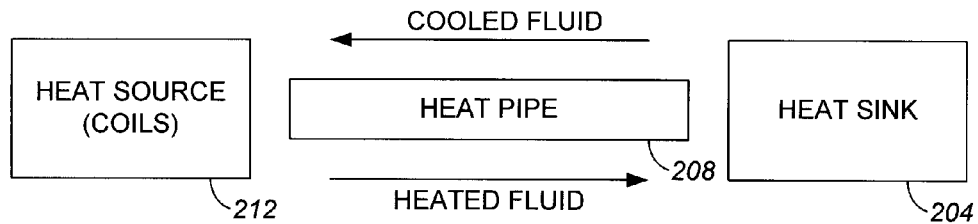
FIG. 2 is a diagrammatic block diagram representation of a heat removal system which includes a detachable heat sink within an overall wafer stage device in accordance with an embodiment of the present invention.

Referring next to FIG. 2, one embodiment of a heat removal system within an overall wafer stage apparatus or device will be described in accordance with the present invention. A heat removal system 200 includes a heat sink 204 and a heat pipe 208. Heat pipe 208 may be arranged between a heat source 212, e.g., heat generating coils of an actuator, and heat sink 204. Heat sink 204 may be a relatively large block of metal, or substantially any material which has a relatively high heat capacity. A material may be considered to have a relatively high heat capacity, or specific heat, when the material can store a relatively high amount of heat energy in a given mass with a given temperature rise. Heat pipe 208 may be coupled to heat sink 204 through quick-release fittings which enable heat sink 204 to be readily decoupled from or coupled to heat pipe 208 when heat sink 204 is decoupled from or coupled to the overall wafer stage apparatus.

When heat is generated by heat source 212, a fluid contained substantially within heat pipe 208 may be heated by heat source 212. The fluid may be, for example, a fluid which may take on a substantially gaseous state when heated, and a substantially liquid state when cooled. Such a fluid may be, for example, water, ammonia, alcohol, benzene, or a commercial refrigerant. Once heated, the fluid may be conducted towards heat sink 204, which effectively removes the heat from the fluid and, as a result, cools the fluid. Typically, heat may be transferred substantially directly from the fluid to heat sink 204 when the heat in the fluid causes the temperature of heat sink 204 to increase. Heat may be removed from the fluid when the temperature of heat sink 204 is lower than the boiling point of the fluid, thereby causing the fluid to condense and transfer heat to heat sink 204. When heat sink 204 removes or obtains the heat from the fluid, heat sink 204 stores the removed heat. The cooled fluid may then be returned through heat pipe 208 to heat source 212. While heat pipe 208 may have substantially any suitable configuration, in the described embodiment, heat pipe 208 may be configured as a hollow cylindrical tube that is at least partially formed from a wicking material. By way of example, heat pipe 208 may include a cotton sleeve which functions such that when the fluid within heat pipe 208 is heated, the fluid may take a substantially gaseous form and pass from heat source 212 to heat sink 204 through the space defined by the cotton sleeve. When heat is removed from the fluid, the cooled fluid may be transported through the cotton material of the sleeve from heat sink 204 to heat source 212.

Once heat is no longer generated by heat source 212, i.e., when a wafer exposure process is effectively completed, heat sink 204 may be detached from heat pipe 208, as well as from the overall wafer stage apparatus. Once detached, heat sink 204 may be subjected to substantially any suitable cooling or heat removal process which removes the heat stored in heat sink 204. Suitable heat removal processes may include, but are not limited to, processes which involve setting heat sink 204 on a cold plate or surface, circulating a cooling fluid through or around heat sink 204, and placing heat sink 204 in a refrigerator.

Figure 3:
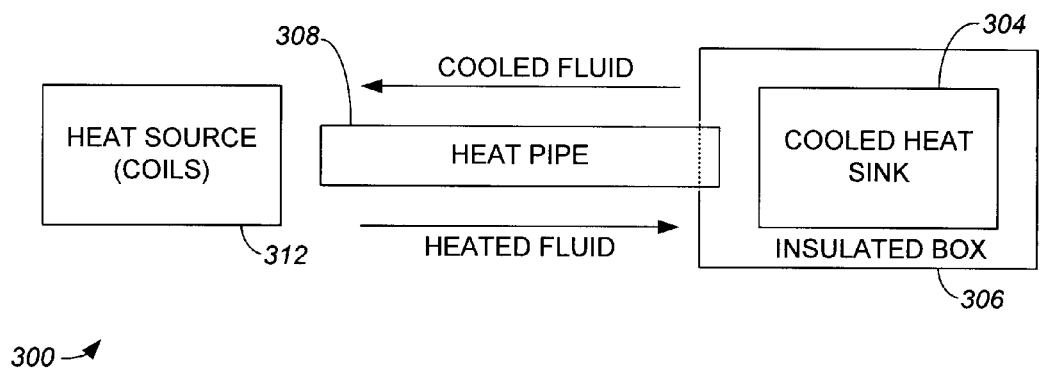
FIG. 3 is a diagrammatic block diagram representation of an insulated heat removal system within an overall wafer stage apparatus or device in accordance with an embodiment of the present invention.

Since an interferometer signal that is associated with an overall wafer stage may be affected by heated air, it may be beneficial to maintain a cool environment around heat sink 204 such that the temperature of heat sink 204 is less likely to cause the air around heat sink 204 to interfere with the interferometer signal. As will be appreciated by those skilled in the art, the interferometer signal may be altered when relatively hot air changes the refractive index associated with the environment in which the overall wafer stage is placed. In order to reduce the amount by which air around a heat sink may be heated, a cooled heat sink may be arranged in an insulated box which may serve to prevent the temperature of air around the heat sink from increasing significantly. FIG. 3 is a diagrammatic block diagram representation of an insulated heat removal system within an overall wafer stage apparatus or device in accordance with an embodiment of the present invention. A heat removal system 300 includes a cooled heat sink 304, an insulated box 306, and a heat pipe 308. Heat pipe 308 may be arranged between a heat source 312 and heat sink 304 to carry heated fluid to heat sink 304 and cooled fluid to heat source 312. Heat that is generated by heat source 312 may be provided to heat sink 304 where the heat is stored.

Like heat sink 204 of FIG. 2, heat sink 304 may be a relatively large block of a material which has a relatively high heat capacity. Heat pipe 308 may be coupled to heat sink 304 through quick-release fittings. Heat pipe 308 may also be detachably coupled to insulated box 306. The use of insulated box 306 may prevent heat sink 304, which may be cooled before being positioned within insulated box 306, from increasing the ambient temperature of air in the vicinity of heat sink 304. That is, substantially any heating of air which occurs around heat sink 304 may effectively be confined within insulated box 306. Insulated box 306 may be a thermos structure, e.g., an evacuated container, or a structure formed from a material with low thermal conductivity such as plastic, a porous foam, or a bubble wrap material.

Although heat sinks may generally be blocks of material which effectively serve only to store heat and, in one embodiment, to cause heat to be removed from a transport medium, heat sinks may also be incorporated into components which serve other purposes within an overall wafer stage. For example, a heat sink may be incorporated as part of a wafer chuck which supports a wafer in an overall wafer stage. By incorporating a heat sink into a wafer chuck, when a wafer exposure process is completed, the wafer chuck may be detached from the overall wafer stage, thereby effectively removing both the wafer and the heat sink.

Figure 4:
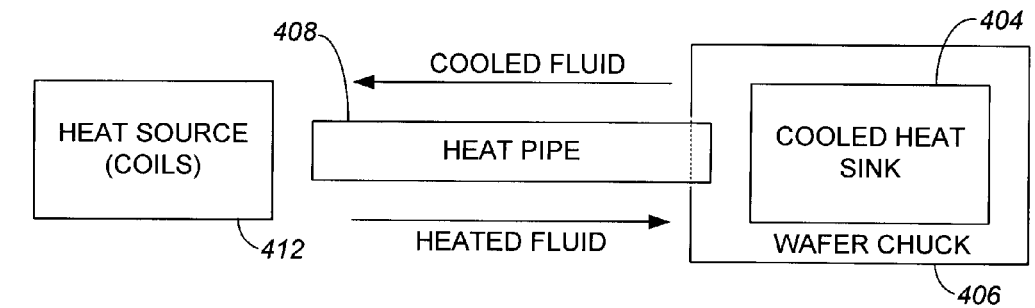
FIG. 4 is a diagrammatic block diagram representation of a heat removal system that includes a heat sink which is a component of a wafer chuck within an overall wafer stage apparatus or device in accordance with an embodiment of the present invention.

FIG. 4 is a diagrammatic block diagram representation of a heat removal system that includes a heat sink which is a component of a wafer chuck within an overall wafer stage apparatus or device in accordance with an embodiment of the present invention. A heat removal system 400 may include a heat pipe 408 that allows heat to be transferred from a heat source 412 to a heat sink 404. Heat sink 404, as previously mentioned, may be a block of material which stores heat and is a part of a wafer chuck 406 which supports a wafer (not shown). In order to ensure that heat stored in heat sink 404 does not impart an unacceptable amount of heat to the wafer, heat sink 404 may be insulated. By way of example, heat sink 404 may be insulated by components associated with wafer chuck 406.

Incorporating heat sink 404 into wafer chuck 406 may enable the processes associated with detaching and reattaching heat sink 404 from an overall stage apparatus to be simplified, e.g., both a wafer and heat sink 404 may be detached from the overall stage apparatus substantially simultaneously. Once wafer chuck 406 is detached from the overall stage apparatus, the wafer supported on wafer chuck 406 may be removed, and heat sink 404 may be removed from wafer chuck 406. Once removed, heat stored in heat sink 404 may be removed from heat sink 404 using substantially any suitable method.

Figure 5:
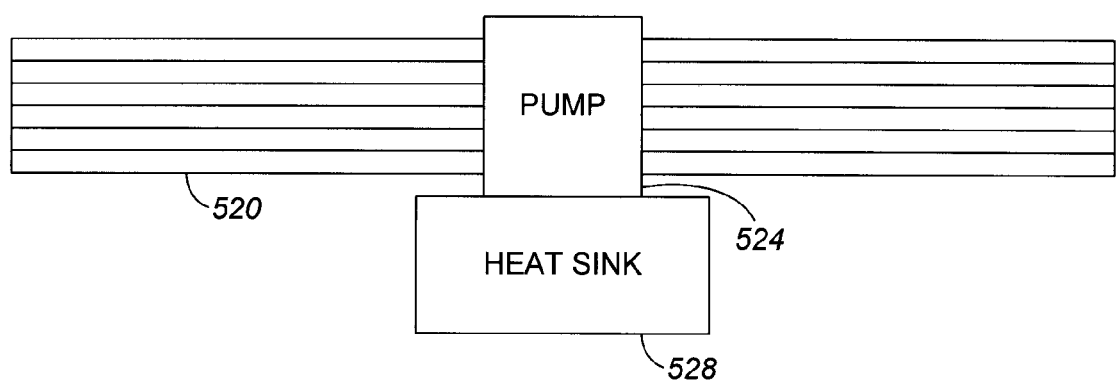
FIG. 5 is a diagrammatic representation of a detachable heat sink which is coupled to cooling tubes and a pump in accordance with an embodiment of the present invention.

As described above, a heat pipe may be used to transfer heated fluid to a detachable heat sink where the heat from the fluid may be stored. It should be appreciated, however, that the mechanism used to provide heat to a detachable heat sink may be widely varied. By way of example, a system which includes cooling tubes and a pump may be used to provide heat to a detachable heat sink. FIG. 5 is a diagrammatic representation of a detachable heat sink which is coupled to cooling tubes and a pump in accordance with an embodiment of the present invention. Cooling tubes 520 may contain a fluid such as coolant that circulates through cooling tubes 520. The coolant may be substantially any suitable coolant including, but not limited to, FluorInert and Novec which are available commercially from 3M Company of St. Paul, Minn.

Cooling tubes 520 may be arranged to pass near the vicinity of a heat source or coils (not shown). Since cooling tubes 520 are coupled to a detachable heat sink 528 which is generally located on a wafer stage, e.g., wafer stage 104 of FIG. 1, cooling tubes 520 generally are not relatively long and do not "snake" through an overall wafer stage device. Cooling tubes 520 also generally do not begin and terminate at a location that is external to the overall wafer stage device. As such, tube drag or significant disturbance forces are typically not introduced within the overall wafer stage device. In other words, a detachable heat sink 528, a heat source, and cooling tubes 520 are substantially all attached to the same moving part and, as a result, there is no relative movement of cooling tubes 520. Thus, there are generally no significant externally generated disturbance forces associated with the overall wafer stage device.

In one embodiment, cooling tubes 520 may come into essentially direct contact with the heat source or with the air around the heat source such that the heat generated by the heat source may be substantially absorbed by the coolant within the cooling tubes 520. A pump 524, which is coupled to detachable heat sink 528, may actively pump the coolant through cooling tubes 520 between the heat source and heat sink 528. An exchange of heat may occur between the coolant that is pumped by pump 524 and heat sink 528, which may be a block of material with a relatively high heat capacity. Once heat is stored in heat sink 528, the cooled coolant may be pumped back towards the vicinity of the heat source.

In order for heat sink 528 to be relatively easily removed once an exposure process involving the overall wafer stage device which includes heat sink 528 is completed, heat sink 528 may be coupled to pump 524 such that connections between pump 524 and heat sink 528 may be readily connected and disconnected. As a result, heat sink 528 may be detached from pump and provided to an external cooling station. Alternatively, pump 524 and beat sink 528 may effectively be a single unit that may be detached from a wafer stage (not shown) of the overall wafer stage device. That is, pump 524 and heat sink 528 may be coupled to the wafer stage using a quick disconnect device that enables pump 524 and heat sink 528 to be efficiently detached from the wafer stage as a substantially single unit.

Figure 6:
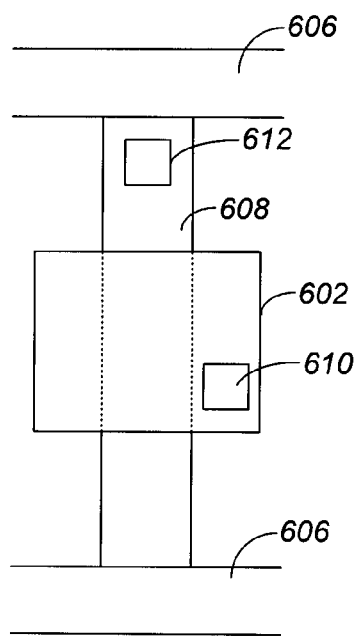
FIG. 6 is a diagrammatic representation of a portion of a precision stage device in accordance with an embodiment of the present invention.

A detachable heat sink may be incorporated substantially anywhere on an overall wafer stage device where the detachable heat sink may be easily accessed without disturbing other sections of the overall wafer stage device. As shown above in FIG. 1, adetachable heat sink may be detachably coupled to a planar motor wafer stage. It should be appreciated, however, that as discussed above with respect to FIG. 4, the detachable heat sink may instead be a part of a wafer chuck and, hence, may be detachably coupled to a wafer table of an overall planar motor wafer stage device. By way of example, in a stage device, a detachable heat sink may be coupled to a wafer table or to a shaft that is coupled to the wafer table. FIG. 6 is a diagrammatic representation of a portion of a precision stage device in accordance with an embodiment of the present invention. A wafer table 602 which is coupled to a shaft 608, e.g., a shaft that is coupled to a linear motor 606, may include a first detachable heat sink 610. A second detachable heat sink 612 may be coupled substantially directly to shaft 608 to absorb heat generated by linear motor 606.

Figure 7:
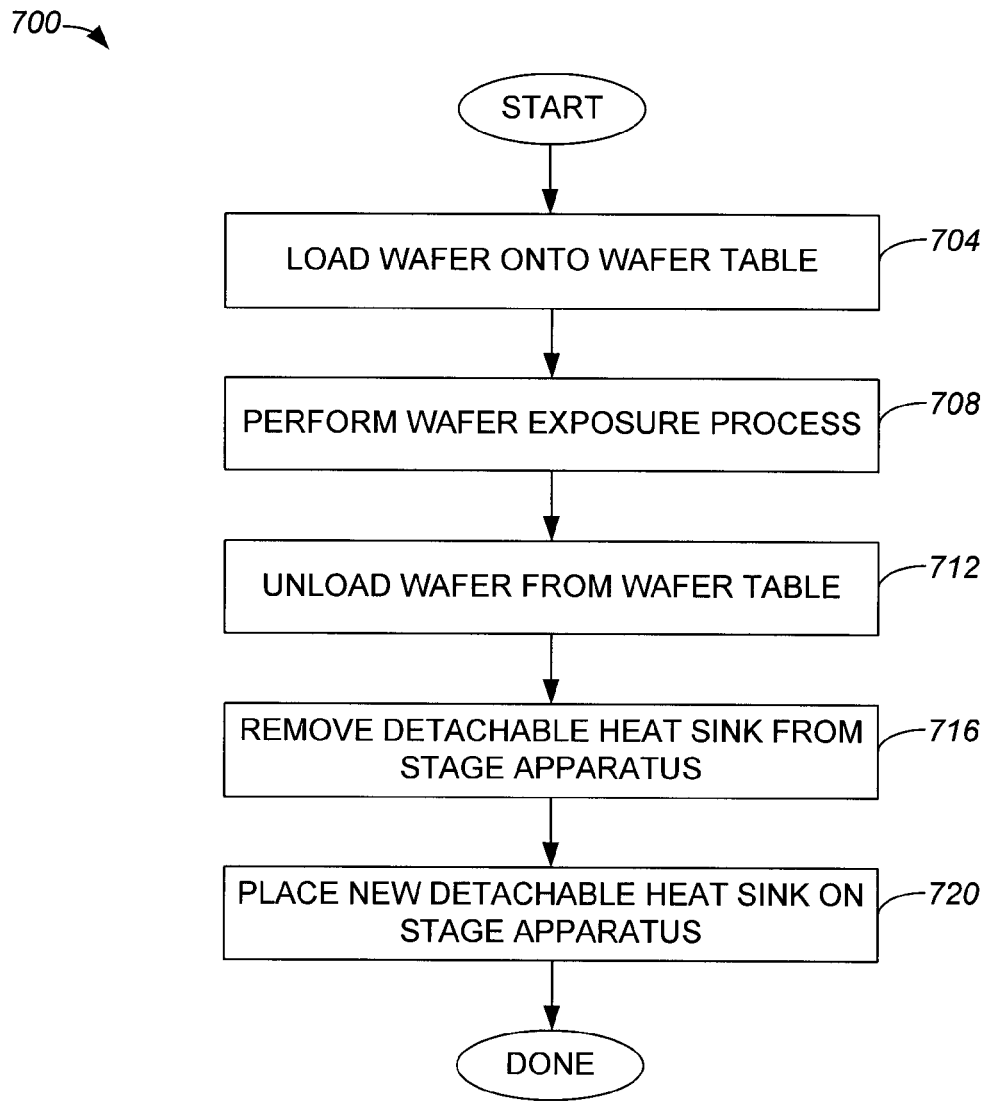
FIG. 7 is a process flow diagram which illustrates the steps associated with a process of processing a wafer which involves the use of a detachable heat sink in accordance with an embodiment of the present invention.

As previously mentioned, a detachable heat sink may be arranged to store heat that is generated by an actuator during a wafer processing process that includes a wafer exposure process. Referring next to FIG. 7, a process of processing a wafer which involves the use of a detachable heat sink will be described in accordance with an embodiment of the present invention. A process 700 begins at step 704 in which a wafer, e.g., a semiconductor wafer, is loaded onto a wafer table. In one embodiment, loading a wafer onto a wafer table may include positioning the wafer using a chuck that is associated with the wafer table. Once the loading of the wafer is accomplished, a wafer exposure process is performed in step 708. In general, the steps associated with the wafer exposure process may include steps associated with the transfer of heat from a coil associated with an actuator to a detachable heat sink, as will be discussed below with respect to FIG. 8.

Upon completion of a wafer exposure process, the wafer is unloaded from the wafer table in step 712. At approximately the same time that the wafer is unloaded from the wafer table, the detachable heat sink may be removed from the overall stage apparatus in step 716. That is, when the wafer is unloaded, the detachable heat sink may also be unloaded or otherwise removed from the overall stage apparatus. Although the detachable heat sink is often separate from the wafer table, it should be appreciated that, in one embodiment, the detachable heat sink may be a component of the wafer table, e.g., the detachable heat sink may be a part of a wafer chuck.

After the detachable heat sink is removed in step 716 from the overall stage apparatus, a new detachable heat sink is placed on the stage apparatus in step 720. In other words, the heated detachable heat sink is effectively replaced by a substantially unheated heat sink. The heated detachable heat sink is typically cooled away from the overall stage apparatus. Once the new detachable heat sink is loaded onto the overall stage apparatus, the process of processing a wafer is completed.

Figure 8:
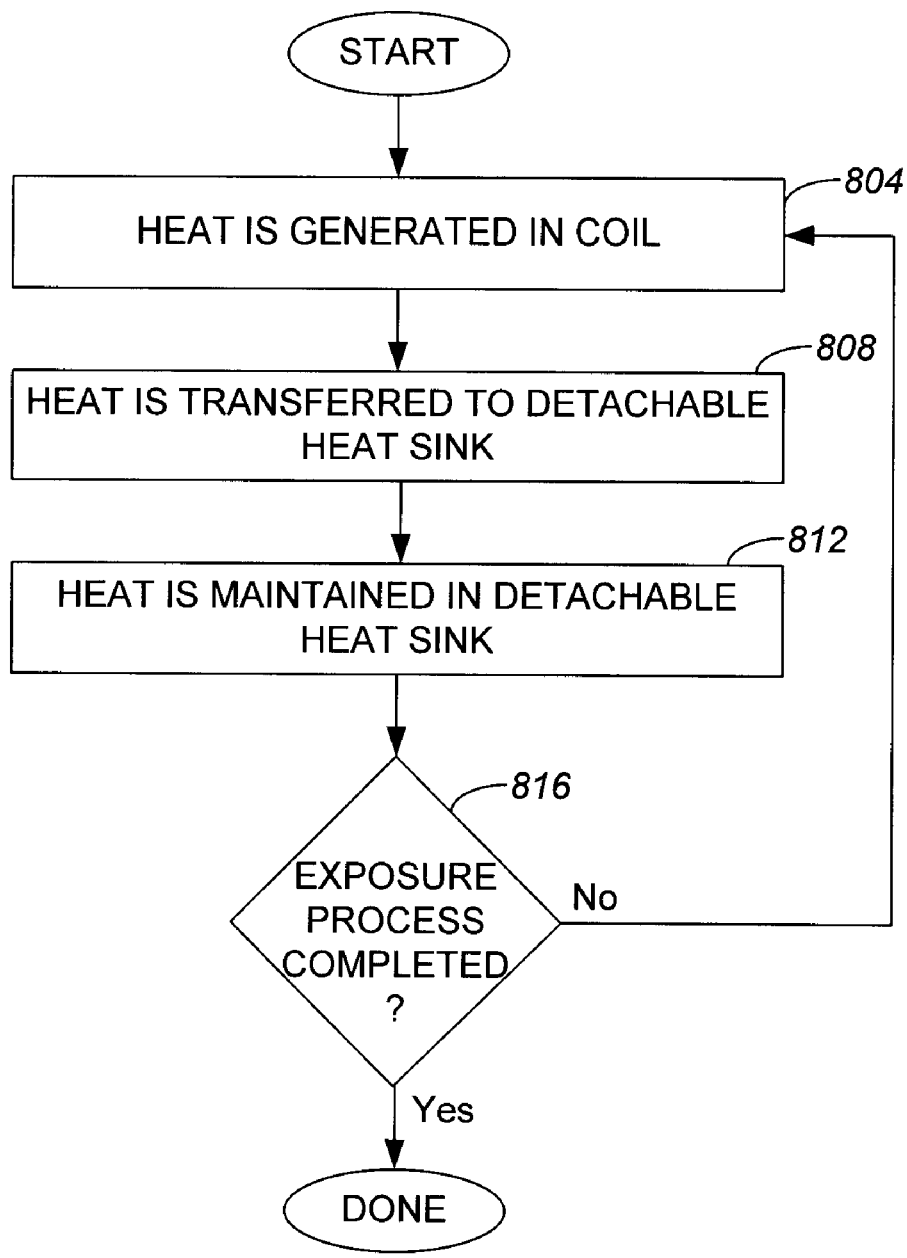
FIG. 8 is a process flow diagram which illustrates the steps associated with using a detachable heat sink during a wafer exposure process, i.e., step 708 of FIG. 7, in accordance with an embodiment of the present invention.

As discussed above, a wafer exposure process generally includes steps associated with transferring heat that is generated by coils associated with actuators which control the motion of a wafer stage and a wafer table to a heat sink. FIG. 8 is a process flow diagram which illustrates the steps associated with using a detachable heat sink during a wafer exposure process, i.e., step 708 of FIG. 7, in accordance with an embodiment of the present invention. A process 708 begins at step 804 in which heat is generated in a coil or, more specifically, a heat generating coil that is part of an actuator which controls the motion of either a wafer stage, e.g., a coarse stage, or a wafer table, e.g., a fine stage. The heat that is generated in the coil is transferred, in step 808, to a detachable heat sink. In general, the mechanism used to transfer heat from the coil to the detachable heat sink may be substantially any suitable mechanism. Suitable mechanisms may include, but are not limited to, coolants that are used in conjunction with heat pipes or pumps.

Once heat is transferred to a detachable heat sink, the heat is effectively maintained in the detachable heat sink in step 812. That is, heat is stored by or substantially captured within the detachable heat sink. In step 816, a determination is made regarding whether the exposure process is completed. If it is determined that the exposure process is not completed, then process flow returns to step 804 in which heat continues to be generated in the coil. Alternatively, if it is determined in step 816 that the exposure process is completed, then the exposure process effectively ends.

A precision stage device which includes a detachable heat sink may be incorporated as part of an apparatus such as a photolithography apparatus. With reference to FIG. 9, a photolithography apparatus which may includes a detachable heat sink will be described in accordance with an embodiment of the present invention. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator or a voice coil motor. The planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., between three to six degrees of freedom, under the control of a control unit 60 and a system controller 62. The movement of wafer positioning stage 52 allows wafer 64 to be positioned at a desired position and orientation relative to a projection optical system 46. Heat generated during the movement of wafer positioning stage 52 may be stored by a detachable heat sink (not shown) that is coupled to wafer positioning stage 52.

Wafer table 51 may be levitated in a z-direction 10b by any number of voice coil motors (not shown), e.g., three voice coil motors. In the described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, and is arranged to project a radiant energy, e.g., light, through a mask pattern on a reticle 68 that is supported by and scanned using a reticle stage which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optics frame 50, and detects the position of reticle stage 44 which supports a reticle 68. Interferometer 58 also outputs position information to system controller 62. Reticle stage 44 is supported on a reticle stage frame 48 and may be supported on the ground through isolators 54.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head. Further, an adjustable force damper may also be applied to a proximity photolithography system that exposes a mask pattern by closely locating a mask and a substrate without the use of a lens assembly. Additionally, an adjustable force damper may be used in other devices including, but not limited to, other semiconductor processing equipment, machine tools, metal cutting machines, and inspection machines.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more detachable heat sinks, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 10:
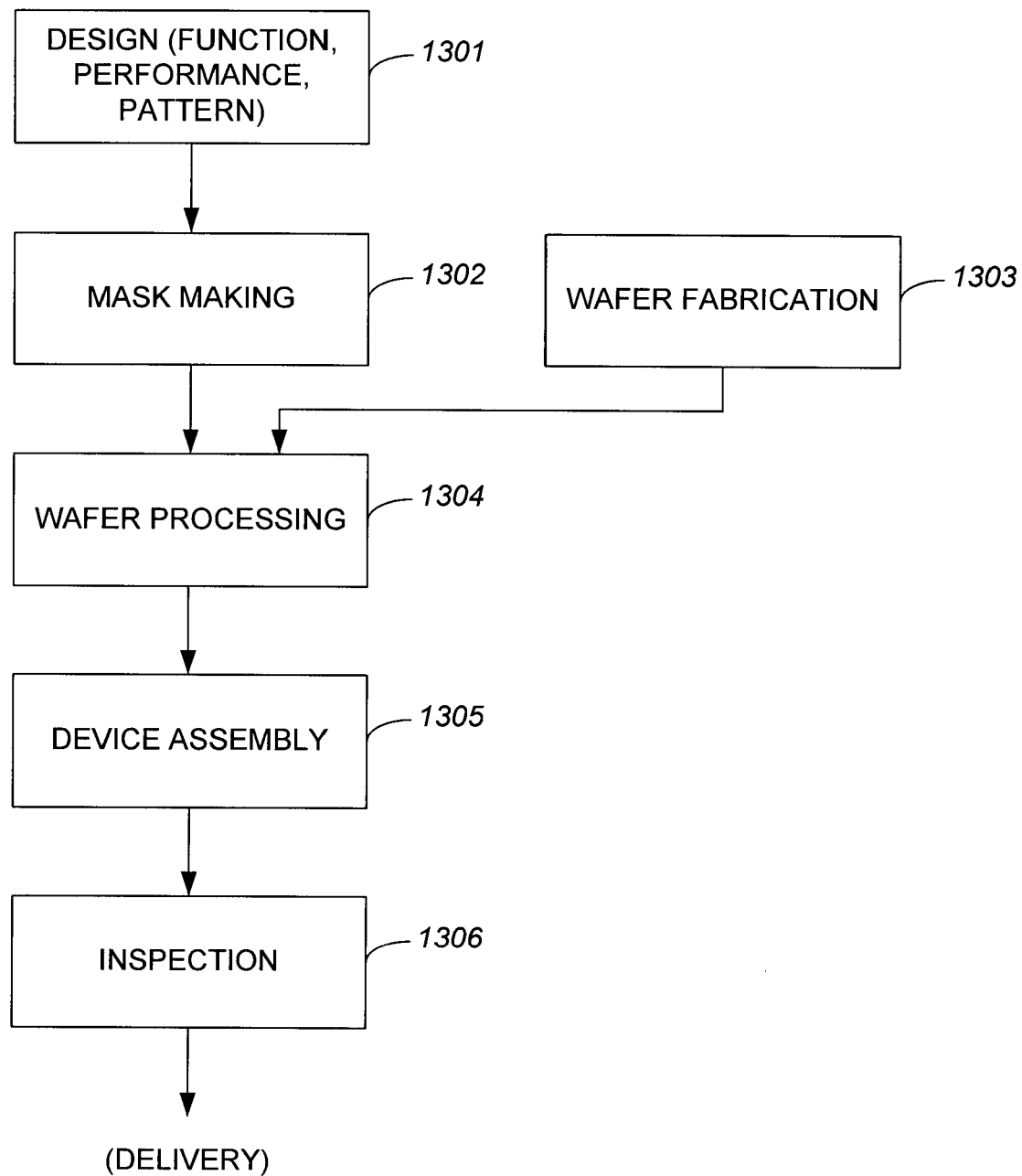
FIG. 10 is a process flow diagram which illustrates the steps associated with fabricating a semiconductor device in accordance with an embodiment of the present invention.

Further, semiconductor devices may be fabricated using systems described above, as will be discussed with reference to FIG. 10. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 11. In step 1305, the semiconductor device is assembled. The assembly of the semiconductor device generally includes, but is not limited to, wafer dicing processes, bonding processes, and packaging processes. Finally, the completed device is inspected in step 1306.

Figure 11:
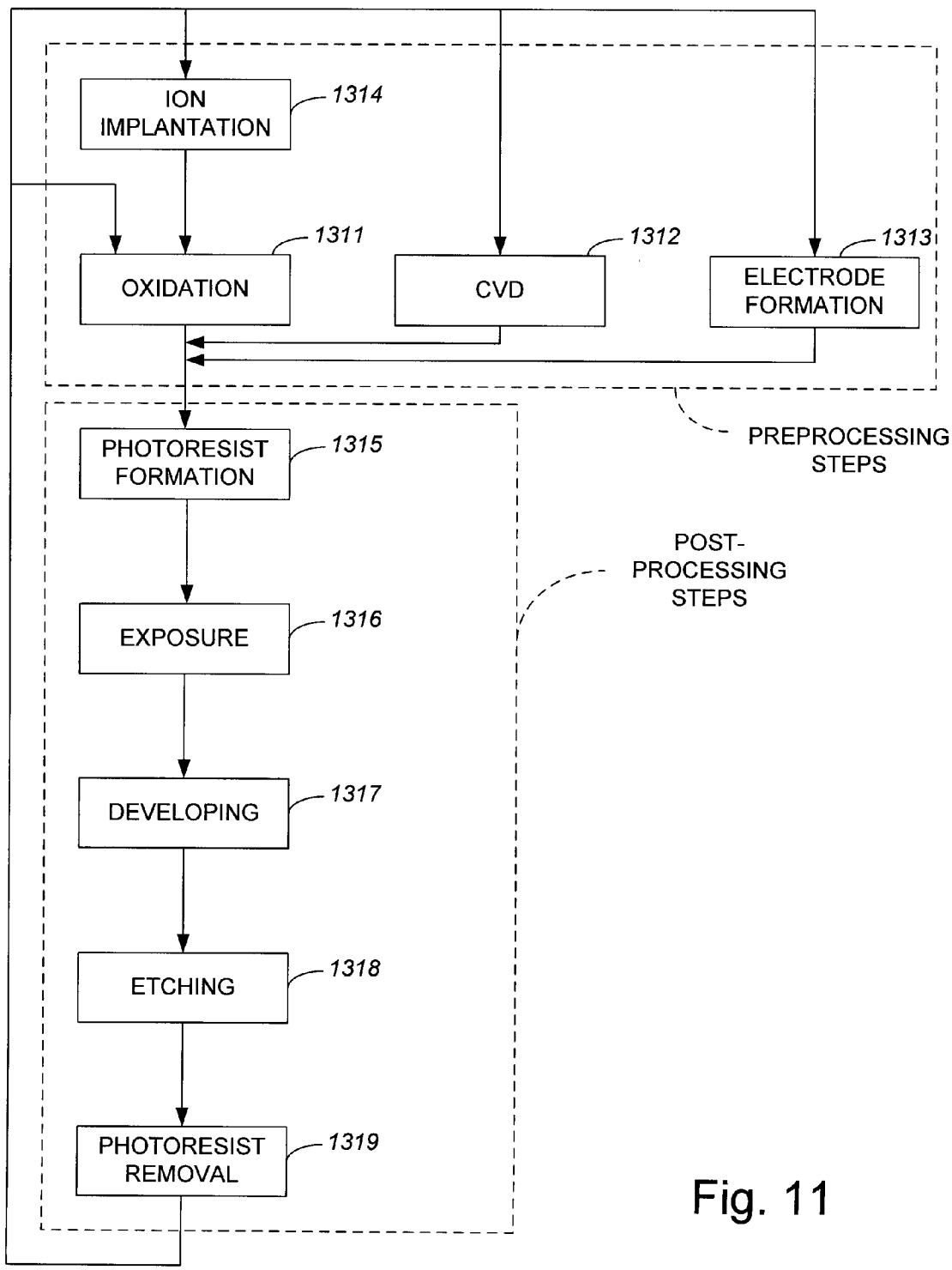
FIG. 11 is a process flow diagram which illustrates the steps associated with processing a wafer, i.e., step 1304 of FIG. 10, in accordance with an embodiment of the present invention.

FIG. 11 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the pre-processing and post-processing steps.

Although only a few embodiments of the present invention have been described, it should be understood that the present invention may be embodied in many other specific forms without departing from the spirit or the scope of the present invention. By way of example, an overall wafer stage apparatus which uses a detachable heat sink has generally been described as including a planar motor stage. In general, however, a detachable heat sink may be used with substantially any suitable stage apparatus, e.g., a conventional stage apparatus or an individual stage. Further, a detachable heat sink may be implemented for use within substantially any system which includes components which generate heat.

While a detachable heat sink has been described as being attached to a wafer stage of an overall wafer stage apparatus, a detachable heat sink may be attached to substantially any component of the overall wafer stage apparatus. For example, a detachable heat sink may be removably attached to a wafer table or a wafer chuck. Alternately, a detachable heat sink may be removably attached to a reticle stage.

A single detachable heat sink may be arranged to store heat from any number of heat sources. In other words, in lieu of a single detachable heat sink being associated with a single heat source, the detachable heat sink may be used to store heat transferred from more than one heat source. Similarly, multiple heat sinks may be used to store heat transferred from one or more heat of heat sources without departing from the spirit or the scope of the present invention.

Heat pipes and pump systems have been described as being suitable for use in transporting heated fluid from a heat source to a heat sink, as well as for transporting cooled fluid back to the heat source. It should be appreciated, however, that the mechanism used to transport fluid or, more generally, a heat transferring medium, may be substantially any suitable mechanism including, but not limited to, a solid conductor such as a copper bar which causes substantially direct contact between the heat source and the heat sink.

In general, the steps associated with the methods of the present invention may vary widely. Steps may be added, removed, altered, and reordered without departing from the spirit or the scope of the present invention. Therefore, the present examples are to be considered as illustrative and not restrictive, and the invention is not to be limited to the details given herein, but may be modified within the scope of the appended claims.

What is claimed is:

1. A method for substantially removing heat from a first location within an overall stage apparatus, the overall stage apparatus being a wafer stage apparatus, the method comprising:
   coupling a material to the overall stage apparatus;
   generating the heat at the first location, wherein the heat is generated at the first location during a wafer exposure process;
   providing the heat from the first location to a heat transferring mechanism, the heat transferring mechanism being arranged to substantially carry the heat away from the first location;
   transferring the heat from the heat transferring mechanism to a second location associated within the overall stage apparatus, the second location including the material, the material being arranged to store the transferred heat;
   storing the transferred heat substantially within the material; and
   detaching the material from the overall stage apparatus after the wafer exposure process is completed.

2. The method of claim 1 wherein the second location is associated with a heat sink, and the material is a material with a relatively high heat capacity.

3. The method of claim 1 wherein the heat transferring mechanism includes a fluid, the fluid being arranged to carry the heat to the second location.

4. The method of claim 1 wherein the material is initially cooled to a temperature below an ambient temperature.

5. A method for operating an exposure apparatus comprising the method for substantially removing heat of claim 1.

6. A method for making an object including at least a photolithography process, wherein the photolithography process utilizes the method of operating an exposure apparatus of claim 5.

7. A method for making a wafer utilizing the method of operating an exposure apparatus of claim 5.

8. A method for substantially removing heat from a heat source within an overall stage apparatus, the method comprising:
providing the heat from the heat source to a heat pipe, the heat pipe being arranged to substantially carry the heat away from the heat source;
transferring the heat from the heat pipe to a detachable heat sink arrangement associated within the stage apparatus, the detachable heat sink arrangement including a material that is arranged to store the transferred heat; and
storing the transferred heat substantially within the material.

9. The method of claim 8 wherein the heat source is an actuator.

10. The method of claim 9 wherein the heat source is a coil of the actuator.

11. The method of claim 8 wherein the heat pipe includes a cylindrical tube that is at least partially formed from a wicking material, the heat pipe further including a fluid, the fluid being arranged to have a substantially gaseous state when heated and a substantially liquid state when cooled.

12. The method of claim 8 wherein the detachable heat sink arrangement includes an insulator, wherein the material is arranged to be at least partially contained in the insulator.

13. The method of claim 12 wherein the insulator is an evacuated container.

14. The method of claim 8 wherein the stage apparatus includes a wafer chuck and the detachable heat sink arrangement is a part of the wafer chuck.

15. The method of claim 14 further including:
detaching the wafer chuck after storing the transferred heat in the material, wherein detaching the wafer chuck includes detaching the detachable heat sink arrangement from the stage apparatus.

16. The method of claim 8 wherein the material is initially cooled to a temperature below an ambient temperature.

17. A method for operating an exposure apparatus comprising the method for substantially removing heat of claim 8.

18. A method for making an object including at least a photolithography process, wherein the photolithography process utilizes the method of operating an exposure apparatus of claim 17.

19. A method for making a wafer utilizing the method of operating an exposure apparatus of claim 17.

20. A method for substantially removing heat from an actuator arrangement of an overall stage apparatus, the method comprising:
providing the heat from the actuator arrangement to a heat transferring mechanism, the heat transferring mechanism being arranged to substantially carry the heat away from the actuator arrangement, wherein the heat transferring mechanism is arranged in direct contact with the actuator arrangement;
transferring the heat from the heat transferring arrangement to a detachable heat sink arrangement associated within the stage apparatus, the detachable heat sink arrangement including a material that is arranged to store the transferred heat; and
storing the transferred heat substantially within the material.

21. The method of claim 20 wherein providing the heat from the actuator arrangement includes providing the heat from a coil of the actuator arrangement.

22. The method of claim 20 wherein the heat transferring mechanism is coupled to the detachable heat sink arrangement.

23. The method of claim 20 wherein the heat transferring mechanism is a heat pipe.

24. The method of claim 20 wherein the heat transferring mechanism is a cooling tube that contains a coolant.

25. A method for operating an exposure apparatus comprising the method for substantially removing heat of claim 20.

26. A method for making an object including at least a photolithography process, wherein the photolithography process utilizes the method of operating an exposure apparatus of claim 25.

27. A method for making a wafer utilizing the method of operating an exposure apparatus of claim 25.

28. The method of claim 1 wherein the material is not actively cooled while in the second location.

29. The method of claim 1 wherein the material is not coupled to a mechanism used to cool the material.

30. A method for substantially removing heat from a first location within a movable stage apparatus, the method comprising:
coupling a material to the movable stage apparatus;
providing an object on the movable stage apparatus;
providing the heat from the first location to a heat transferring mechanism, the heat transferring mechanism being arranged to substantially carry the heat away from the first location;
transferring the heat from the heat transferring mechanism to a second location associated with the movable stage apparatus, the second location including the material, the material being arranged to store the transferred heat; and
detaching the material from the movable stage apparatus after the heat is substantially removed from the first location.

31. A method for substantially removing heat from a first location within a movable stage apparatus, the method comprising:
coupling a material to the movable stage apparatus;
providing an object on the movable stage apparatus;
providing the heat from the first location to a heat transferring mechanism, the heat transferring mechanism being arranged to substantially carry the heat away from the first location;
transferring the heat from the heat transferring mechanism to a second location associated with the movable stage apparatus, the second location including the material, the material being arranged to store the transferred heat; and
replacing the material with another material after the heat is substantially removed from the first location.

* * * * *